United States Patent
Wu et al.

(10) Patent No.: US 6,232,208 B1
(45) Date of Patent: May 15, 2001

(54) SEMICONDUCTOR DEVICE AND METHOD OF MANUFACTURING A SEMICONDUCTOR DEVICE HAVING AN IMPROVED GATE ELECTRODE PROFILE

(75) Inventors: David Wu, San Jose; Dong-Hyuk Ju, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,428

(22) Filed: Nov. 6, 1998

(51) Int. Cl.[7] .................................................. H01L 21/3205
(52) U.S. Cl. ..................... 438/585; 438/279; 438/199; 438/705; 438/511; 438/514
(58) Field of Search .................................. 438/199, 279, 438/585, 705, 754, 417, 511, 514

(56) References Cited

U.S. PATENT DOCUMENTS

| 5,496,750 | * | 3/1996 | Moslehi ................................ 438/199 |
| 5,866,930 | * | 2/1999 | Saida et al. ........................... 257/316 |
| 5,904,994 | * | 5/1999 | Dodabalapur et al. ............... 428/690 |
| 5,940,722 | * | 8/1999 | Tamura ................................ 438/471 |
| 5,952,675 | * | 9/1999 | Katoh .................................... 257/59 |
| 5,966,606 | * | 10/1999 | Ono ...................................... 438/303 |
| 5,969,398 | * | 10/1999 | Murakami ............................ 257/412 |
| 6,001,726 | * | 12/1999 | Nagabushnam et al. ............. 438/618 |
| 6,013,332 | * | 1/2000 | Goto et al. ............................ 427/530 |
| 6,017,781 | * | 1/2000 | Shimizu et al. ...................... 438/158 |
| 6,017,819 | * | 1/2000 | Brigham et al. ...................... 438/657 |

OTHER PUBLICATIONS

Robert F. Pierret, Modular Series on Solid State Devices, vol. I Semiconductor Fundamentals Second Edition, 1987, Addison Wesley Publishing Company, pp. 4–6.*

C.Y. Chang and S.M. Sze, ULSI Technology, 1996, The McGraw–Hill Companies, Inc., pp. 489–492.*

* cited by examiner

Primary Examiner—Matthew Smith
Assistant Examiner—Renzo N. Rocchegiani (57) ABSTRACT

A semiconductor device is provided with a gate electrode having a substantially rectangular profile by depositing a layer of amorphous or microcrystalline silicon. The amorphous or microcrystalline silicon is doped with impurities, before patterning to form the gate electrode, to reduce gate depletion. The doped gate electrode layer is then patterned to form a gate electrode having a substantially rectangular profile.

15 Claims, 6 Drawing Sheets

SEMICONDUCTOR DEVICE AND METHOD OF MANUFACTURING A SEMICONDUCTOR DEVICE HAVING AN IMPROVED GATE ELECTRODE PROFILE

TECHNICAL FIELD

The present invention relates to semiconductor devices and to a method of manufacturing high density semiconductor devices having improved gate electrode profiles. The present invention has particular applicability in manufacturing high density CMOS semiconductor devices with design features of 0.25 microns and under.

BACKGROUND ART

The escalating requirements for high density and performance associated with ultra large scale integration semiconductor devices require design features of 0.25 microns and under, increased transistor and circuit speeds, high reliability and increased manufacturing throughput. The reduction of design features to 0.25 microns and under challenges the limitations of conventional semiconductor methodology.

Conventional semiconductor devices typically comprise a semiconductor substrate, normally doped monocrystalline silicon, and a plurality of interleaved dielectric and conductive layers formed thereon. In a conventional semiconductor device 100 illustrated in FIG. 1, substrate 1 is provided with field oxide 2 for isolating an active region comprising source/drain regions 3, and a gate electrode 4, typically of doped polysilicon, above the semiconductor substrate with gate oxide 5 therebetween. Interlayer dielectric layer 6, typically silicon dioxide, is then deposited thereover and openings formed by conventional photolithographic and etching techniques. The openings are filled with conductive material to establish electrical contact between subsequently deposited conductive layer 8, typically aluminum or an aluminum-base alloy, and source/drain regions 3 through contacts 7, and to transistor gate electrode 49. Dielectric layer 9, typically silicon dioxide, is deposited on conductive layer 8, and another conductive layer 10, typically aluminum or an aluminum-base alloy, is formed on dielectric layer 9 and electrically connected to conductive layer 8 through vias 11.

Figure 1:
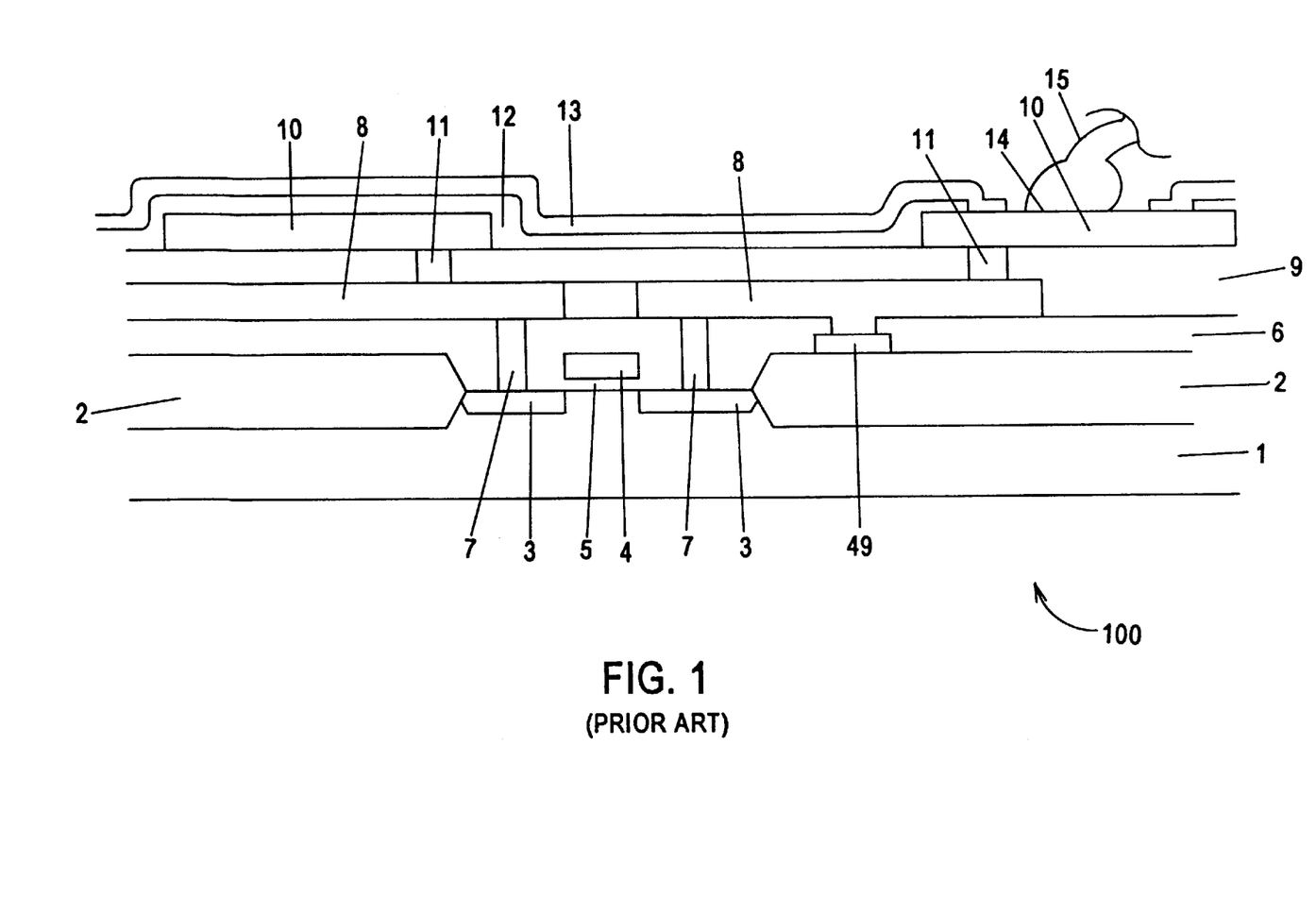
FIG. 1 schematically illustrates the cross-section of a conventional semiconductor device.

With continued reference to FIG. 1, conductive layer 10 is the uppermost conductive layer and, hence, constitutes the wire bonding layer. Dielectric layer 12, also typically silicon dioxide, is deposited, and a protective dielectric scratch resistant topside layer 13 deposited thereon. Protective dielectric layer 13 is typically comprises a nitride layer, such as silicon nitride ($Si_3N_4$). Alternatively, protective dielectric layer 13 may comprise a dual topcoat comprising a nitride layer on an oxide layer. The protective dielectric layer 13 provides scratch protection to the semiconductor device and protection against moisture and impurity contamination during subsequent processing. After deposition of protective dielectric layer 13, conventional photolithographic etching techniques are employed to form an opening to expose wire bonding layer 10 for external connection by means of bonding pad 14 and electrically conductive wires 15 or an external connection electrode (not shown).

Although only two conductive layers 8 and 10 are depicted in FIG. 1 for illustrative convenience, conventional semiconductor devices are not so limited and may comprise more than two conductive layers, depending on design requirements, e.g., five conductive metal layers. Also in the interest of illustrative convenience, FIG. 1 does not illustrate any particular type of plug or barrier layer technology. However, such technology is conventional and, therefore, the details of such features are not set forth herein.

As device features continually shrink in size, various circuit structures/parameters become increasingly important. For example, the profile of gate electrode 49 after etching must be substantially rectangular, i.e., the side surfaces being substantially parallel to each other and substantially perpendicular to the upper surface of semiconductor substrate 1, to ensure optimum transistor performance and reliability.

Conventional semiconductor methodology comprises depositing a layer of polycrystalline silicon material followed by etching to form gate electrodes. However, due to the large grain size of polycrystalline silicon, it is difficult to form a polysilicon gate electrode with a substantially rectangular profile by etching.

Subsequently, ion implantation is conducted to form source/drain regions of a transistor having a targeted channel length. However, since the profile of the gate electrode is often non-rectangular and non-uniform, the channel length of the transistor is difficult to control. For example, variations in the profile of the gate electrode adversely affect the targeted channel length of the transistor, thereby affecting transistor performance. Certain non-uniformities in the profile can also cause performance degradation, e.g., transistor drive current non-uniformities and asymmetry.

Therefore, a need exists for a semiconductor device and a method of manufacturing a semiconductor device having a substantially rectangular gate electrode profile.

SUMMARY OF THE INVENTION

An advantage of the present invention is a method of manufacturing a semiconductor device having a gate electrode with a substantially rectangular profile.

Another advantage of the present invention is a semiconductor device with a substantially rectangular gate electrode profile.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other objects are achieved in part by a method of manufacturing a semiconductor device. The method includes forming a dielectric layer on an upper surface of a semiconductor substrate and forming a conductive layer on the dielectric layer. The method also includes doping the conductive layer before patterning the conductive layer. The method further includes patterning the conductive layer to form a gate electrode having an upper surface and side surfaces, with the side surfaces being substantially parallel to each other and substantially perpendicular to the upper surface of the semiconductor substrate.

Another aspect of the present invention is a semiconductor device including a semiconductor substrate comprising monocrystalline silicon. The semiconductor device also includes a dielectric layer formed on an upper surface of the semiconductor substrate. The semiconductor device further includes a gate electrode comprising doped amorphous or microcrystalline silicon with the gate electrode side surfaces substantially parallel to each other and substantially perpendicular to the upper surface of the semiconductor substrate.

Other advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout.

DESCRIPTION OF THE INVENTION

The present invention addresses and solves problems associated with using polycrystalline silicon to form a gate electrode, thereby enabling the formation of transistors with gate electrodes having substantially rectangular profiles. Conventional semiconductor methodology comprising depositing a layer of polysilicon material followed by etching to form gate electrodes can result in gate electrodes having undesirable non-rectangular, non-uniform profiles. Subsequently formed source/drain regions and the channel length of the transistors can be adversely affected, thereby impacting device performance.

Embodiments of the present invention solve problems associated with non-rectangular polysilicon gate electrodes by forming gate electrodes from amorphous silicon. The inventive methodology includes depositing a layer of amorphous silicon on the gate oxide. The inventive methodology also includes ion implanting to dope the amorphous silicon layer, prior to forming the gate electrode, to reduce gate depletion. Subsequently, the doped amorphous silicon layer is etched to form a gate electrode having a substantially rectangular profile.

Figure 2:
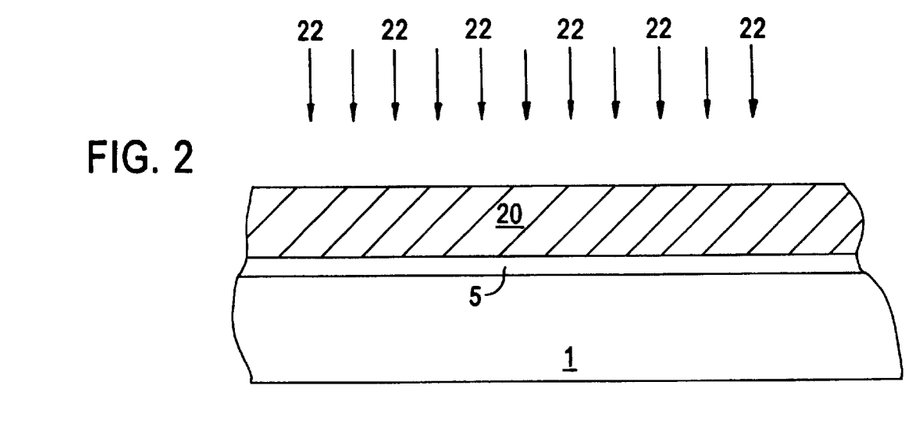
FIG. 2 illustrates formation of an amorphous silicon layer and impurity implantation according to an embodiment of the present invention.

According to an embodiment of the present invention illustrated in FIG. 2, an initial gate dielectric layer 5, such as silicon oxide, is formed on semiconductor substrate 1 as in conventional practices. The present invention departs from conventional methodology by depositing a layer of amorphous silicon 20, e.g., by chemical vapor deposition (CVD), at a targeted thickness for forming a gate electrode. For example, it has been found suitable to deposit an amorphous silicon layer 20 having a thickness of about 1000 Å to about 3000 Å.

Advantageously, amorphous silicon does not have the large grain size of polycrystalline silicon, enabling amorphous silicon layer 20 to have a smoother surface and to be more easily etched to obtain a gate electrode having a substantially rectangular profile. Additionally, the deposition of amorphous silicon layer 20 occurs at a temperature of about 500° C. to about 600° C., which is less than the temperature of about 650° C. conventionally employed to deposit polysilicon. The lower temperature deposition process reduces the generation of crystalline defects in substrate 1, attendant upon high temperature processes. These crystalline defects promote diffusion of subsequently implanted impurities. Accordingly, the degree of thermal enhanced diffusion of subsequently implanted impurities in substrate 1 is reduced, with an attendant reduction in source/drain junction depth ($X_j$).

In employing amorphous silicon, impurities subsequently implanted to dope the gate electrode and form source/drain regions in semiconductor substrate 1 do not diffuse completely through the amorphous silicon to the gate electrode/gate oxide interface. This causes gate depletion, i.e., lack of carriers at the gate electrode/gate oxide interface, resulting in decreased capacitance and reduced drive current.

Accordingly, the present invention further departs from conventional methodology and prevents gate depletion problems associated with amorphous silicon by implanting impurities prior to forming the gate electrode. Adverting to FIG. 2, impurities are ion implanted, as indicated by arrows 22, to dope amorphous silicon layer 20. N-type impurities or P-type impurities can be implanted, depending upon whether an N-channel MOSFET or a P-channel MOSFET is formed.

For example, N-type impurities, such as arsenic, can be implanted at a dosage of about $1\times10^{14}$ atoms/cm$^2$ to about $2\times10^{15}$ atoms/cm$^2$ and an implantation energy of about 10 KeV to about 50 KeV to dope amorphous silicon layer 20 for an N-channel MOSFET. Alternatively, other N-type impurities, such as phosphorous, can be implanted at various dosages and implantation energies based on the particular design requirements.

Additionally, P-type impurities, such as boron, can be implanted at a dosage of about $1\times10^{14}$ atoms/cm$^2$ to about $1\times10^{15}$ atoms/cm$^2$ and an implantation energy of about 5 KeV to about 20 KeV to dope amorphous silicon layer 20 for a P-channel MOSFET.

Advantageously, separating gate electrode layer 20 doping from subsequent source/drain formation enables the subsequently formed gate electrode to be fully doped, thereby avoiding gate electrode depletion. Additionally, subsequently formed source/drain regions can achieve a desirably shallow junction depth ($X_j$), e.g., less than about 800 Å for a gate electrode having a width of about 0.25 microns.

Figure 3:
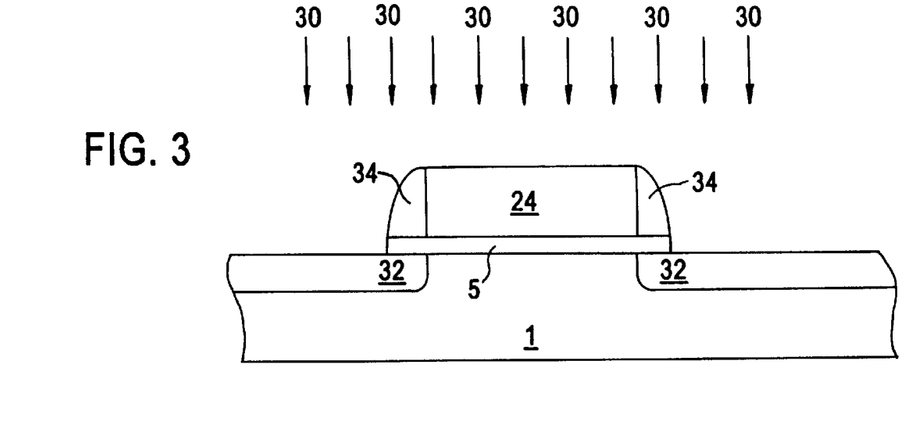
FIG. 3 illustrates the formation of a gate electrode and sidewall spacers for the device of FIG. 2.

After the N-type or P-type impurities are implanted, doped amorphous silicon layer 20 is etched to form gate electrode 24, as shown in FIG. 3. As discussed previously, amorphous silicon is more easily etched than polycrystalline silicon, resulting in gate electrode 24 having a substantially rectangular profile, i.e., the side surfaces are substantially parallel to each other and substantially perpendicular to the upper surface of semiconductor substrate 1. The rectangular profile of gate electrode 24 enables the transistor to avoid various non-uniformities affecting performance.

Subsequently, using gate electrode 24 as a mask, impurities are ion implanted, as indicated by arrows 30 in FIG. 3, at a relatively low energy to form lightly-doped source/drain (LDD) implants 32. For example N-type impurities, such as arsenic or phosphorous, can be implanted at a dosage of about $1\times10^{13}$ atoms/cm$^2$ to about $1\times10^{15}$ atoms/cm$^2$ and an implantation energy of about 10 KeV to about 30 KeV to form LDD implants 32 for an N-channel MOSFET. Alternatively, P-type impurities, such as boron, can be implanted at a dosage of about $1\times10^{14}$ atoms/cm$^2$ to about $1\times10^{15}$ atoms/cm$^2$ and an implantation energy of about 5 KeV to about 25 KeV to form LDD implants 32 for a P-channel MOSFET. Other N-type or P-type impurities can also be implanted at various dosages and implantation energies based on the particular design requirements.

Subsequent to LDD implantation, a layer of dielectric material, such as a silicon oxide, a silicon nitride or a silicon oxynitride, is deposited and anisotropically etched to form insulating sidewall spacers 34 on the side surfaces of gate electrode 24, as shown in FIG. 3. In etching to form sidewall spacers 34, gate oxide layer 5 is etched, thereby exposing the surface of semiconductor substrate 1 adjacent sidewall spacers 34.

Figure 4:
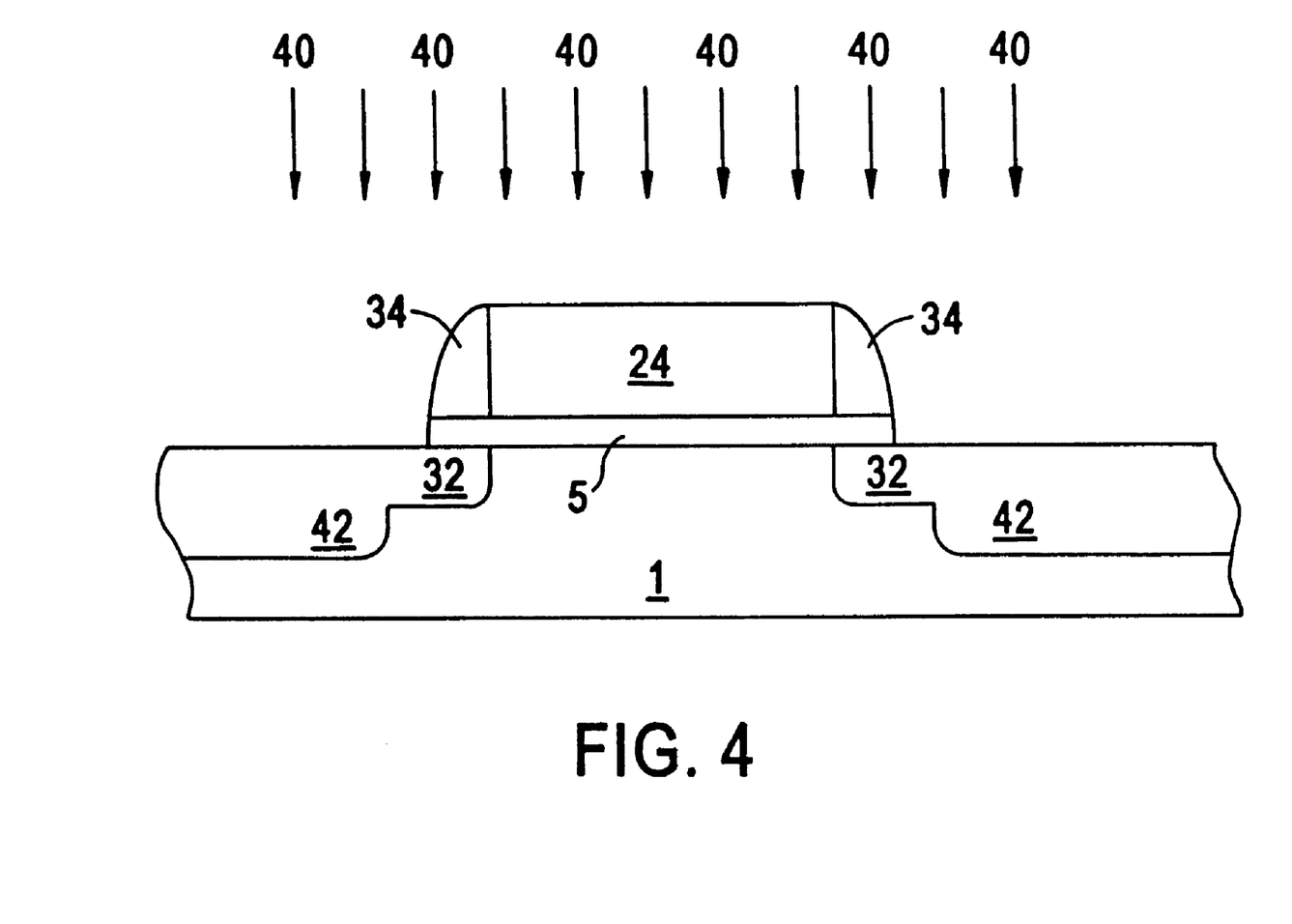
FIG. 4 illustrates the formation of source/drain regions for the device of FIG. 3.

Adverting to FIG. 4, ion implantation is then conducted as indicated by arrows 40, using gate electrode 24 and sidewall spacers 34 as a mask, to form moderately-doped source/drain (MDD) or heavily-doped source/drain (HDD) implants 42.

For example, N-type impurities such as arsenic or phosphorous, can be implanted at a dosage of about $1\times10^{14}$ atoms/cm$^2$ to about $5\times10^{15}$ atoms/cm$^2$ and an implantation energy of about 20 KeV to about 50 KeV to form the MDD/HDD implants 42 of an N-channel MOSFET. Alternatively, P-type impurities, such as boron, can be implanted at a dosage of about $1\times10^{15}$ atoms/cm$^2$ to about $3\times10^{15}$ atoms/cm$^2$ and an implantation energy of about 10 KeV to about 40 KeV to form the MDD/HDD implants 42 of a P-channel MOSFET. Other N-type or P-type impurities can be implanted at various dosages and implantation energies based on the particular design requirements.

Activation annealing is then conducted to activate LDD implants 32 and MDD/HDD implants 42. Activation annealing is typically performed at a temperature of about 900° C. to about 1100° C. to activate the impurity implanted regions 32 and 42 and form source/drain regions in semiconductor substrate 1.

The resulting semiconductor structure illustrated in FIG. 4 advantageously eliminates or substantially reduces problems associated with polycrystalline silicone gate electrodes. Additionally, the surface of amorphous silicon gate electrode 24 is generally smoother than a similarly formed gate electrode of polycrystalline silicon. This smoother surface facilitates subsequent semiconductor lithography, as the fewer discontinuities in the surface of gate electrode 24 reduce reflections during lithography.

In accordance with another embodiment of the present invention illustrated in FIGS. 5–8, an amorphous silicon layer is deposited, as described previously, to subsequently form gate electrodes. Additionally, in order to reduce the number of manufacturing steps in forming semiconductor devices, the present invention provides methodology for efficiently forming both N-channel and P-channel transistors having substantially rectangular gate electrode profiles.

Figure 5:
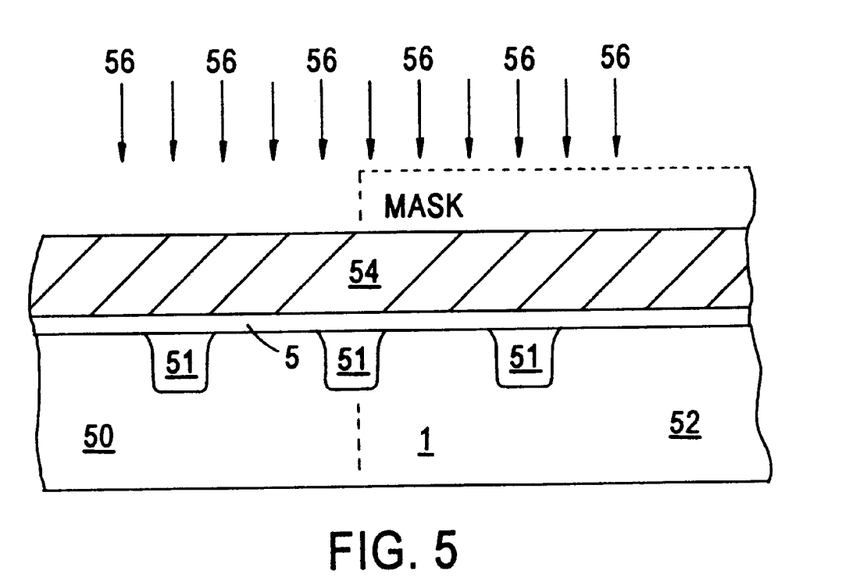
FIG. 5 illustrates the formation of an amorphous silicon layer and impurity implantation according to an embodiment of the present invention.

Adverting to FIG. 5, semiconductor substrate 1 is divided into N-well region 50 and P-well region 52, shown separated by a dotted line in substrate 1. N-well region 50 is the region where P-channel transistors will be formed and P-well region 52 is the region where N-channel transistors will be formed. Trenches 51, typically filled with an oxide material, separate adjacent active areas in substrate 1. An initial dielectric layer 5, such as silicon oxide, is formed on semiconductor substrate 1 as in conventional practices. The present invention departs from conventional methodology by depositing a layer of amorphous silicon 54, e.g., by CVD, at a targeted thickness for forming gate electrodes. For example, it has been found suitable to deposit amorphous silicon layer 54 having a thickness of about 1000 Å to about 3000 Å.

As discussed previously, amorphous silicon does not have the large grain size of polycrystalline silicon, enabling amorphous silicon layer 54 to be more easily etched to obtain a gate electrode having a substantially rectangular profile. Additionally, the deposition of amorphous silicon layer 54 occurs at a lower temperature than polysilicon, thereby reducing the generation of crystalline defects in substrate 1 with an attendant reduction in $X_J$ of subsequently implanted impurities.

The present invention further departs from conventional methodology by doping amorphous silicon layer 54, before forming source/drain regions, for both P-channel and N-channel transistors. N-channel transistor region 52, i.e., P-well region, is masked, e.g., by a photoresist material, followed by ion implantation. P-type impurities are ion implanted, as indicated by arrows 56 in FIG. 5, to dope amorphous silicon layer 54.

For example, P-type impurities, such as boron, can be implanted at a dosage of about $1\times10^{14}$ atoms/cm$^2$ to about $1\times10^{15}$ atoms/cm$^2$ and an implantation energy of about 5 KeV to about 20 KeV to dope amorphous silicon layer 54 for a P-channel MOSFET. Subsequently, the mask over N-channel region 52 is removed.

Figure 6:
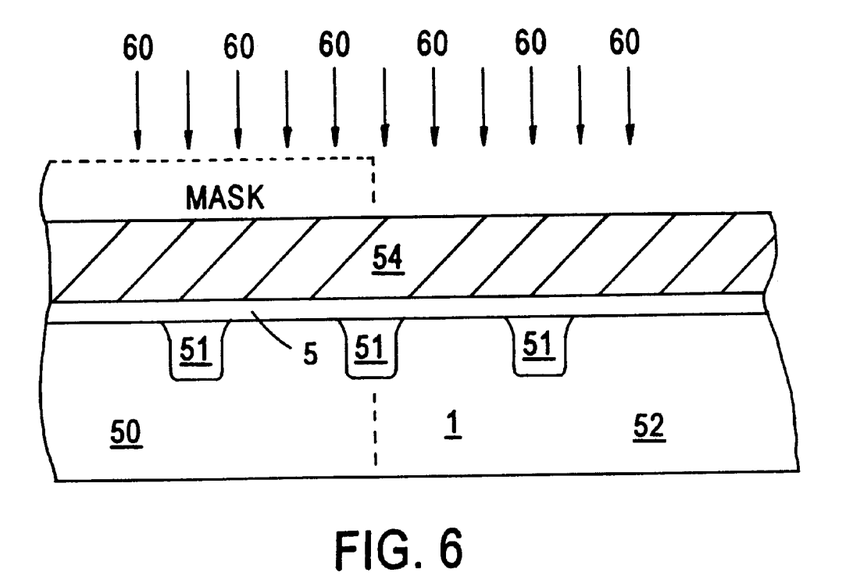
FIG. 6 illustrates impurity implantation for the device FIG. 5.

Adverting to FIG. 6, P-channel region 50, i.e., N-well region, is then masked, e.g. by a photoresist material, followed by ion implantation. N-type impurities are ion implanted, as indicated by arrows 60 to dope amorphous silicon layer 54.

For example, N-type impurities, such as arsenic, can be implanted at a dosage of about $1\times10^{14}$ atoms/cm$^2$ to about $2\times10^{15}$ atoms/cm$^2$ and an implantation energy of about 10 KeV to about 50 KeV to dope amorphous silicon layer 54 for an N-channel MOSFET. Alternatively, other N-type impurities, such as phosphorous, can be implanted at various dosages and energies based on the particular design requirements. Subsequently, the mask over P-channel region 50 is removed.

Advantageously, implanting impurities prior to patterning the gate electrode enables subsequently formed N-channel gate electrodes and P-channel, gate electrodes to avoid gate depletion problems. Further, by separating the gate electrode doping from subsequent source/drain region formation, the present invention achieves a desirably shallow $X_J$, e.g., less than about 800 Å for a gate electrode having a width of about 0.25 microns.

Figure 7A:
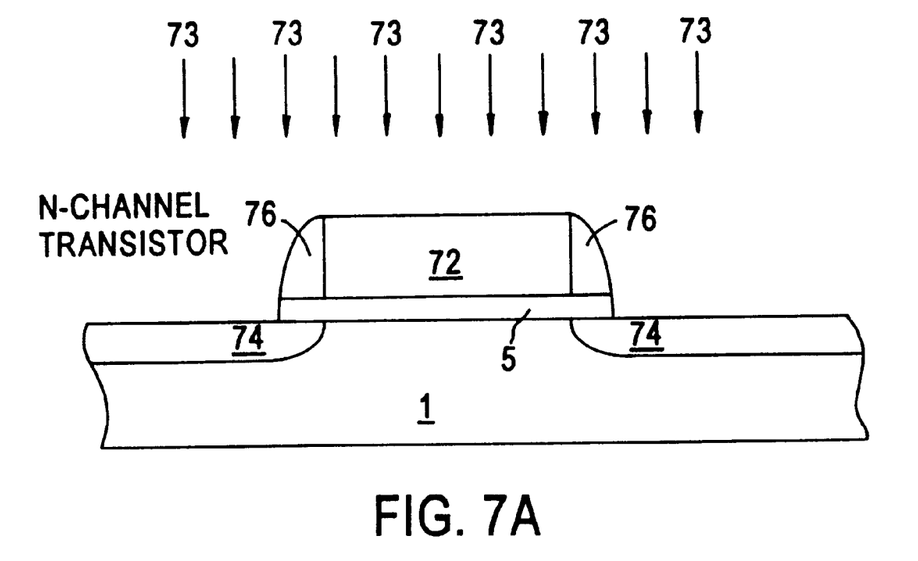
FIGS. 7A and 7B illustrate the formation of sidewall spacers and source/drain regions for an N-channel transistor according to an embodiment of the present invention.
Figure 8:
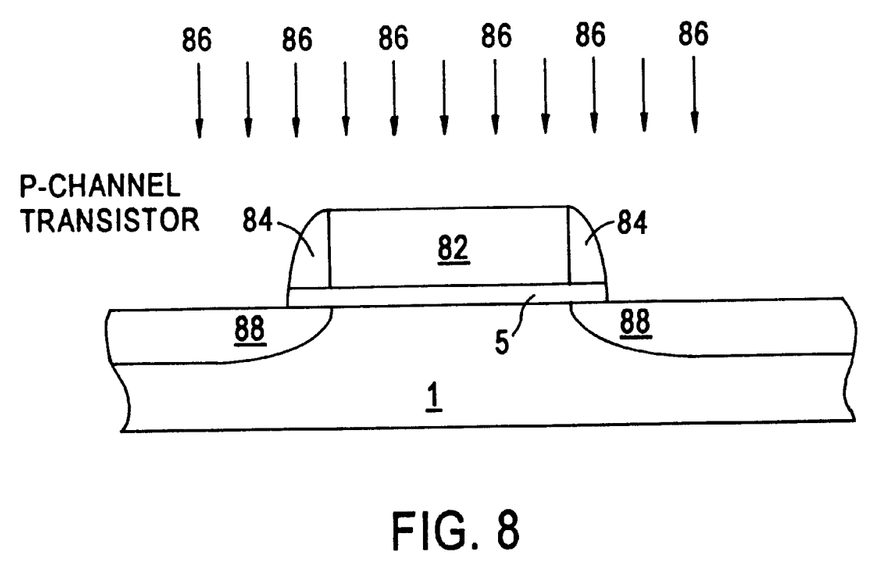
FIG. 8 illustrates the formation of sidewall spacers and source/drain regions for a P-channel transistor according to an embodiment of the present invention.

After the N-type and P-type impurities are implanted, doped amorphous silicon layer 54 is etched to form gate electrode 72 for an N-channel MOSFET, as shown in FIG. 7A and gate electrode 82 for a P-channel MOSFET, as shown in FIG. 8. Advantageously, amorphous silicon layer 54 is more easily etched than a similarly formed polycrystalline silicon layer, resulting in gate electrodes 72 and 82 having substantially rectangular profiles. The rectangular profiles enable the transistors to avoid various non-uniformities affecting performance.

Subsequently, N-type and P-type impurities are ion implanted to form source/drain regions of the respective N-type and P-type transistors. For example, according to an embodiment of the present invention, N-type impurities are ion implanted, as indicated by arrows 73 in FIG. 7A, to form LDD implants 74. Next, sidewall spacers are formed by depositing a layer of insulating material, e.g., an oxide, a nitride or an oxynitride material. The insulating material is anisotropically etched to form sidewall spacers 76 on the side surfaces of gate electrode 72, as shown in FIG. 7A, and sidewall spacers 84 on the side surfaces of gate electrode 82, as shown in FIG. 8. In etching to form sidewall spacers, 76 and 84, gate oxide layer 5 is also etched, thereby exposing the surface of semiconductor substrate 1 adjacent sidewall spacers 76 and 84.

Subsequently, N-type impurities are ion implanted to form moderately doped source/drain (MDD) or heavily doped source/drain (HDD) implants. Adverting to FIG. 7B, N-type impurities are ion implanted, as indicated by arrows 78, using gate electrode 72 and sidewall spacers 76 as a mask, to form MDD/HDD implants 79.

Figure 7B:
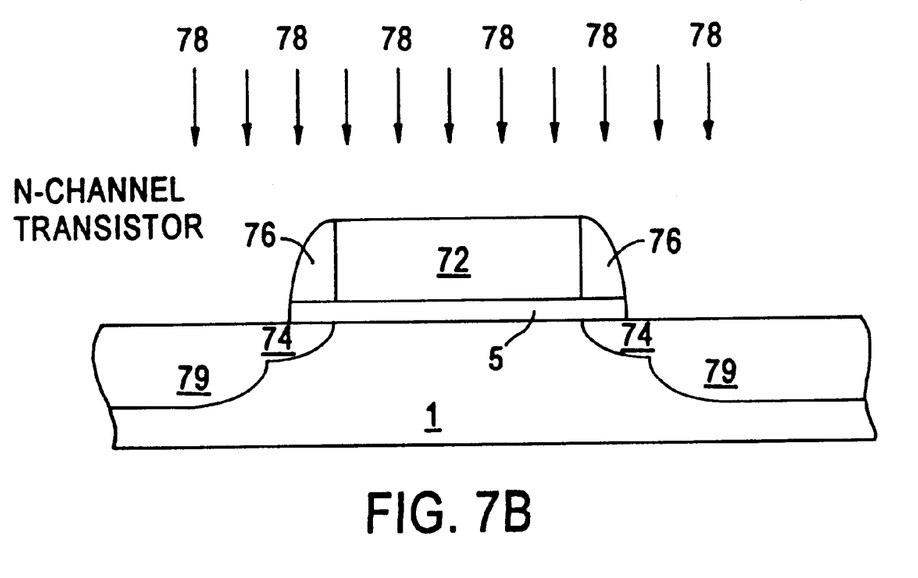

For example, N-type impurities such as arsenic or phosphorous, can be implanted at a dosage of about $1 \times 10^{14}$ atoms/cm$^2$ to about $5 \times 10^{15}$ atoms/cm$^2$ and an implantation energy of about 20 KeV to about 50 KeV to form MDD/HDD implants 79 of an N-channel MOSFET.

Next, P-type impurities are ion implanted, as indicated by arrows 86 in FIG. 8, using gate electrode 82 and sidewall spacers 84 as a mask, to form source/drain implants 88. For example, P-type impurities, such as boron, can be implanted at a dosage of about $1 \times 10^{14}$ atoms/cm$^2$ to about $3 \times 10^{15}$ atoms/cm$^2$ and an implantation energy of about 10 KeV to about 30 KeV to form source/drain implants 88 of a P-channel MOSFET. Alternatively, P-channel transistor can be formed having shallow LDD implants and deeper MDD/HDD implants, in a similar manner to the N-channel transistor illustrated in FIG. 7B.

Activation annealing is then conducted to activate LDD implants 74 and MDD/HDD implants 79 in the N-channel transistor and source/drain implants 88 in the P-channel transistor. Annealing is typically performed at a temperature of about 900° C. to about 1100° C. to activate the impurity implanted regions, forming the source/drain regions.

The resulting semiconductor structures illustrated in FIGS. 7B and 8 advantageously eliminate or substantially reduce problems associated with non-rectangular polysilicon gate electrodes. Additionally, as discussed previously, the surfaces of amorphous silicon gate electrodes 72 and 82 are generally smoother than similarly formed gate electrodes of polycrystalline silicon. These smoother surfaces facilitate subsequent semiconductor lithography, as the fewer discontinuities in the surfaces of the gate electrodes reduce reflections during lithography.

In accordance with another embodiment of the invention, a layer of microcrystalline silicon which is non-polycrystaline silicon is deposited instead of depositing a layer of amorphous silicon. Microcrystalline silicon is deposited, e.g., by CVD, followed by doping to reduce gate depletion. That is, the microcrystalline silicon layer is doped with either N-type or P-type impurities, in a similar manner as discussed previously regarding doping an amorphous silicon layer.

The doped microcrystalline silicon layer is subsequently etched to form gate electrodes. Advantageously, microcrystalline silicon is more easily etched than polycrystalline silicon due to smaller grain size. It has been found that employing microcrystalline silicon enables the present invention to achieve a substantially rectangular gate electrode profile. Subsequent processing steps, discussed previously in connection with FIGS. 3–8, are performed to form source/drain regions of N-channel and P-channel transistors, based on the particular design requirements.

In another embodiment of the present invention, the layer of amorphous or microcrystalline silicon deposited to form gate electrodes can be doped during deposition. For example, a dopant can be introduced during CVD so that the deposited semiconducting layer contains the desired impurities. Advantageously, the deposited impurities reduce gate depletion for the subsequently formed gate electrode. Additionally, depositing a doped semiconducting layer saves manufacturing time associated with ion implanting the desired impurities. Subsequent processing steps, discussed previously in connection with FIGS. 3–8, are performed to form source/drain regions of N-channel and P-channel transistors, based on the particular design requirements.

Thus, in accordance with the present invention, problems associated with polycrystalline gate electrodes are eliminated or substantially reduced, thereby enabling the formation of gate electrodes with substantially rectangular profiles. Additionally, the present invention reduces the formation of crystalline defects, thereby reducing transient enhanced diffusion of implanted impurities during activation annealing. As a result, source/drain implants can achieve a desirably shallow $X_j$. Further, the present invention facilitates semiconductor lithography through the formation of gate electrodes with smoother surfaces, thereby reducing reflections. The present invention also provides semiconductor processing enabling the formation of N-channel and P-channel transistors in an efficient manner, thereby advantageously increasing manufacturing throughput.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

The dielectric and conductive layers utilized in manufacturing a semiconductor device in accordance with the present invention can be deposited by conventional deposition techniques. For example, metallization techniques such as various types of chemical vapor deposition (CVD) processes, including low pressure chemical vapor deposition (LPCVD) and enhanced chemical vapor deposition (ECVD) can be employed.

The present invention enjoys applicability in the manufacturing of semiconductor devices and particularly in semiconductor devices comprising design features of 0.25 microns and under, with increased transistor and circuit speeds and improved reliability. The present invention is applicable to the formation of any of various types of semiconductor devices and, hence, details have not been set forth herein in order to avoid obscuring the thrust of the present invention. In practicing the present invention, conventional photolithographic and etching techniques are employed and, hence, the details of such techniques have not been set forth herein in detail.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a dielectric layer on an upper surface of a semiconductor substrate;

forming an amorphous silicon layer on and in contact with the dielectric layer;

doping the amorphous silicon layer; and patterning the doped amorphous silicon layer to form a gate electrode having an upper surface and side surfaces, wherein the side surfaces are substantially parallel to each other and substantially perpendicular to the upper surface of the semiconductor substrate.

2. The method of claim 1, comprising:

doping the amorphous silicon layer by ion implanting impurities.

3. The method according to claim 2, comprising implanting P-type impurities at an implantation dosage of about $1\times10^{14}$ atoms/cm$^2$ to about $1\times10^{15}$ atoms/cm$^2$ and an implantation energy of about 5 KeV to about 20 KeV to dope the amorphous silicon layer.

4. The method according to claim 2, comprising implanting N-type impurities at an implantation dosage of about $1\times10^{14}$ atoms/cm$^2$ to about $2\times10^{15}$ atoms/cm$^2$ and an implantation energy of about 10 KeV to about 50 KeV to dope the amorphous silicon layer.

5. The method according to claim 1, comprising forming the amorphous silicon layer by chemical vapor deposition.

6. The method according to claim 5, wherein the amorphous silicon layer comprises amorphous silicon containing N-type impurities or P-type impurities.

7. The method according to claim 1, wherein the semiconductor device comprises a CMOS semiconductor device having a P-channel transistor region and an N-channel transistor region, which method comprises:

masking the N-channel transistor region;

implanting P-type impurities, before patterning the amorphous silicon layer, to dope the amorphous silicon layer;

masking the P-channel transistor region;

implanting N-type impurities, before patterning the amorphous silicon layer, to dope the amorphous silicon layer; and patterning the amorphous silicon layer to form a first gate electrode of an N-channel transistor and a second gate electrode of a P-channel transistor, each gate electrode having an upper surface and side surfaces wherein the side surfaces of each gate electrode are substantially parallel to each other and substantially perpendicular to the upper surface of the semiconductor substrate.

8. The method according to claim 7, further comprising:

implanting N-type impurities, using the first gate electrode as a mask, to form N-type lightly doped implants of the N-channel transistor.

9. The method according to claim 8, further comprising:

depositing an insulating layer on the semiconductor substrate;

etching the insulating layer to form insulating sidewall spacers on the side surfaces of the first and second gate electrodes;

implanting N-type impurities, using the first gate electrode and insulating sidewall spacers as a mask, to form N-type moderately doped or heavily doped implants of the N-channel transistor;

implanting P-type impurities, using the second gate electrode and insulating sidewall spacers as a mask, to form P-type source/drain implants of the P-channel transistor; and activation annealing to form source/drain regions of the N-channel transistor and the P-channel transistor.

10. The method according to claim 9, comprising ion implanting N-type impurities at an implantation dosage of about $1\times10^{14}$ atoms/cm$^2$ to about $5\times10^{15}$ atoms/cm$^2$ and an implantation energy of about 20 KeV to about 50 KeV to form the N-type moderately or heavily doped implants.

11. The method according to claim 10, comprising ion implanting P-type impurities at an implantation dosage of about $1\times10^{14}$ atoms/cm$^2$ to about $3\times10^{15}$ atoms/cm$^2$ and an implantation energy of about 10 KeV to about 30 KeV to form the P-type source/drain implants.

12. The method according to claim 9, wherein the insulating material comprises a silicon oxide, a silicon nitride or a silicon oxynitride.

13. The method according to claim 8, comprising ion implanting N-type impurities at an implantation dosage of about $1\times10^{13}$ atoms/cm$^2$ to about $1\times10^{15}$ atoms/cm$^2$ and an implantation energy of about 10 KeV to about 30 KeV to form the N-type lightly doped implants.

14. The method according to claim 7, wherein the semiconductor substrate comprises monocrystalline silicon and the dielectric layer comprises silicon oxide.

15. A method of manufacturing a semiconductor device, which method comprises:

forming a dielectric layer on an upper surface of a semiconductor substrate;

forming a microcrystalline silicon on and in contact with the dielectric layer;

doping the microcrystalline silicon layer; and patterning the doped microcrystalline silicon layer to form a gate electrode having an upper surface and side surfaces, wherein the side surfaces are substantially parallel to each other and substantially perpendicular to the upper surface of the semiconductor substrate.

* * * * *